United States Patent [19]

Hees et al.

[11] Patent Number: 4,734,316

[45] Date of Patent: Mar. 29, 1988

[54] ENAMELLINGS WITH HETEROGENEOUS STRUCTURE

[75] Inventors: Bruno Hees, Langenfeld; Hans Hoffmann, Leichlingen; Matjaz Florjancic, Stuttgart; Horst Richter, Boeblingen; Karin Ruess, Stuttgart; Stauros Smernos, Stuttgart; Otto Thaidigsmann, Stuttgart, all of Fed. Rep. of Germany

[73] Assignee: Bayer Aktiengesellschaft, Leverkusen, Fed. Rep. of Germany

[21] Appl. No.: 885,939

[22] Filed: Jul. 15, 1986

[30] Foreign Application Priority Data

Jul. 20, 1985 [DE] Fed. Rep. of Germany ....... 3525972

[51] Int. Cl.$^4$ .............................................. B05D 1/00
[52] U.S. Cl. ..................................... 428/210; 428/428; 428/901; 501/14
[58] Field of Search ..................... 501/14, 15, 17, 18, 501/21, 27; 428/428, 432, 210, 901

[56] References Cited

FOREIGN PATENT DOCUMENTS 1131844 12/1984 U.S.S.R. .................. 501/14

OTHER PUBLICATIONS

CA, 106(10):77295q, Crystallized Enamel Substrate, Nakayama et al., 9/3/86.

Primary Examiner—Ferris H. Lander
Attorney, Agent, or Firm—Connolly & Hutz

[57] ABSTRACT

An article of manufacture useful as the base for an electronic circuit board is a substrate with an enamel layer having a heterogeneous structure containing at least two different phases obtained by applying a homogeneous, alkali-containing enamel powder to the substrate followed by heating at 850° C. to 1,000° C. wherein the enamel power has the composition as follows:

| | |
|---|---|
| $SiO_2$ | 40–50% by weight |
| $Al_2O_3$ | 8–15% by weight |
| $Na_2O + K_2O$ | 4–16% by weight |
| $CaO + BaO$ | 25–35% by weight |
| $MgO$ | 0–3% by weight |
| $B_2O_3$ | 0–10% by weight. |

10 Claims, No Drawings

ENAMELLINGS WITH HETEROGENEOUS STRUCTURE

BACKGROUND OF THE INVENTION

The present invention relates to enamellings with a heterogeneous structure having at least two different phases. These enamellings are distinguished by their high mechanical and thermal stability, low thermal coefficient of expansion, high insulation resistance and excellent electrical properties.

Metal cores covered with such enamels are particularly suitable for use as substrates for the assembly of printed circuit boards and electronic circuits. The layer of enamel acts as insulator on which metallic circuit structures may be applied. With the addition of active (IC) and passive components, such printed circuit boards may be used for the construction of electronic component groups.

For many years it has been known to those skilled in the art of electronic circuits that electronic circuit boards could be constructed from substrates such as phenol resin impregnated paper and epoxy glass as well as $Al_2O_3$. Each of those substrates has their own drawbacks for use as electronic circuit board substrates.

The conventional synthetic resin circuit boards, for example, no longer satisfy the physical and electric requirements arising in many cases from new semiconductor components. On account of the high stray powers of some electronic components, auxiliary constructions are required for the removal of heat.

$Al_2O_3$ substrates which are used in hybrid technology show an improvement in physical and electrical properties in this respect. However, the range of application of $Al_2O_3$ ceramics is limited by brittleness to substrate sizes of less than 10×10 cm.

With a view to overcoming the abovementioned difficulties of these technologies, metal substrates coated with enamel have in recent times been used as bases for printed circuit boards. It was found that the advantageous physical and electrical properties could then be combined with excellent mechanical stability.

Enamel, like all other vitreous materials, has a wide softening range which is dependent upon the temperature. The result is that, in the known enamelling technology, stoving of the enamel layer must lower the viscosity sufficiently to enable the enamel particles to fuse together, but sufficient hardness or strength can only be obtained by cooling to a considerably lower temperature. The difference between the stoving temperature and the maximum use temperature is normally from 300° to 400° C.

Thus if the screen printing technique were used, for example, for the manufacture of printed circuits on enamelled steel substrates and the enamel layer were stoved at a temperature of 850° C., then the conductive tracks would have to be stoved at a temperature of not over 550° C.

Although special types of enamel could be developed, even those would soften at temperatures higher than about 620° to 650° C. so that it would be necessary to develop suitable screen printing pastes for such maximum temperatures. It would be desirable to use the usual pastes employed for ceramic substrates but a simple shift in the softening range to higher temperatures is contraindicated by the fact that structural changes take place in steel at temperatures of 900° C. and higher, and these changes inevitably result in a certain permanent deformation of the substrate which can then no longer be kept flat as required.

SUMMARY OF THE INVENTION

It has now surprisingly been found that if enamellings have a structure of at least two different phases formed from the glass phase, the temperature difference between stoving of the enamel layer and stoving of the conductive tracks could be reduced to such an extent that a smooth and closed, i.e. non-porous enamel layer can be produced at temperatures below 900° C. and the metal layer can be burnt into this enamel layer at 850° C.

DETAILED DESCRIPTION

The present invention relates to new enamellings having a heterogeneous structure of at least two different phases resulting from the glass phase, obtainable by electrophoretic deposition of homogeneous, alkali-containing enamel from an aqueous suspension and a heat treatment in the range of 800° to 1000° C.

The composition of the enamel appears to be of decisive importance for determining the special properties of these enamellings according to the invention. The advantageous properties found for the enamel are obtained by means of the following oxidic constituents which are present after fusion to an enamel frit as homogeneous glass:

| | | (% by wt.) | | |
|---|---|---|---|---|
| $SiO_2$ | 40–50% | | $B_2O_3$ | 0–10% |
| $Al_2O_3$ | 8–15% | | | |
| $Na_2O$ | 0–15% | | | |
| $K_2O$ | 4–14% | | $Na_2O + K_2O$ | 4–16% |
| $CaO$ | 9–32% | | $CaO + BaO$ | 25–35% |
| $BaO$ | 0–20% | | | |

$MgO$, $MoO_3$ and $TiO_2$ may be present in amounts of up to 3% as "accompanying oxides".

Enamel frits having the following composition are particularly preferred:

| | | (% by wt.) |
|---|---|---|
| $SiO_2$ | 40–45% | |
| $Al_2O_3$ | 10–14% | |
| $Na_2O$ | 0–3 | |
| $K_2O$ | 5–12 | |
| $CaO + BaO$ | 26–30 | |
| $B_2O_3$ | 0–5. | |

The enamelling is generally applied electrophoretically although the enamel powder could quite well be applied as powder electrostatically or by means of a paste containing the enamel powder.

A process for electrophoretic application of inorganic, oxidic surface-protective layers has been disclosed in German Pat. No. 1,621,406.5. An electrophoretic method of application is optimal for achieving the high quality of the application as regards uniformity and coating of the walls of the perforations as required for the manufacture of the enamelled steel substrates as bases for printed circuit boards.

The enamelling according to the invention enable the qualitative advantages of the above-mentioned patented process to be fully utilized. The large scale technical use of this process has in recent years led to the development of high quality coatings in the enamelling industry and proved their value for practical application. One essential feature for enabling the process to be carried out is the deposition of the enamel from an aqueous suspension. Although electrophoretic applications from enamel suspensions with organic solvents are known a laboratory scale, their use in practice entails considerable difficulties.

A system of this kind is employed according to U.S. Pat. No. 4,355,155 and U.S. Pat. No. 4,358,541 for producing enamel layers on steel substrates for the manufacture of circuit boards. The emulsions used in these processes, however, can only be deposited by this method and when applied from suspensions with water as dispersing agent they do not give rise to electrophoretically deposited layers.

The enamels according to the invention have the advantage that they can be deposited electrophoretically from aqueous suspensions and benefit from the outstanding properties of the process according to German Pat. No. 1,621,406 and ensure excellent electric values in spite of their alkali content.

After application to the steel substrate and drying of the layer at about 80°–100° C., the enamel is subjected to a heat treatment, i.e. a stoving process. Temperatures below 900° C., preferably 850°–900° C., are employed for this heat treatment. The composition according to the invention ensures that at the beginning of the stoving process, the glass structure is sufficiently fluid to enable the enamel particles to fuse together to form a closed, non-porous layer. It is surprisingly found that stoving is accompanied by the development of crystal phases which together with the remaining glass matrix raise the temperature-dependent softening range to such a level that after the stoving process the layer can withstand high temperatures without undergoing any changes. A printed circuit subsequently applied may therefore be heat treated, for example, at 850° C.

Due to the special composition of the enamel and the suitable stoving process, a heterogeneous, multiphase enamel layer is formed from the homogeneous enamel particles.

The steel substrates coated with the enamellings according to the invention may be used for a wide variety of purposes.

Apart from the above-mentioned applications in electronics, the products could be used in other high temperature situations in which an increase in the stoving temperature above 900° C. would be impossible for constructional reasons or on account of the materials used.

The invention will now be explained in more detail with the aid of the following Examples, but is not limited thereby.

EXAMPLE 1

An enamel having the oxidic composition (1) is ground in a ball mill to form an aqueous suspension with the addition of floatation agents such as clay, bentonite, etc. The degree of fineness of milling is 3 units of residue on a screen having 16,900 meshes/cm$^2$, as determined by the measuring instrument of Bayer.

This suspension is processed electrophoretically, the enamel particles being deposited on the anode within 17 seconds when a voltage of 100 V is applied from an external source so that a sufficient layer thickness of about 140 μm will be obtained after stoving. After the loose enamel particles adhering to the surface only as a result of immersion have been rinsed off in a vat filled with water, the electrophoretically deposited layer left on the object is dried and stoved at 890° C. for 30 minutes.

In the course of this stoving, the layer melts to form a closed, non-porous surface. At the same time that the layer melts, crystalline phases separate from the glass and reach such a high proportion of the whole system in the course of the stoving process that an enamelled metal substrate obtained by this process can be repeatedly exposed to temperatures of up to 900° C. without any damage to the enamel layer.

A substrate prepared as described above is printed with commercial Ag/Pd paste, the peak temperature as the paste is burnt in being 850° C., which is passed through in 10 minutes. The conductive tracks applied by this procedure have excellent adherence, soldering characteristics and bonding.

| (1) | $SiO_2$ | 44.8 |
|---|---|---|
| | $Al_2O_3$ | 13.0 |
| | $Na_2O$ | 3.8 |
| | $K_2O$ | 12.0 |
| | $CaO$ | 10.5 |
| | $BaO$ | 15.9 |

EXAMPLE 2

An enamel of composition (2) is deposited electrophoretically, rinsed and dried in the same manner as described in Example 1. Stoving is carried out in a batch furnace with a simulated temperature curve of the kind passed through in a continuous furnace so that the peak temperature is 890° C. and is passed through in 20 minutes. An enamelled steel substrate produced by this procedure is printed with commercial Au paste by the screen printing technique and is then stoved in a continuous furnace at 850° C. for 10 minutes.

A second printing process is then carried out to apply soldering points of Au/Pd paste to the ends of conductive tracks for establishing the electric connections, and these are again stoved at 850° C. for 10 minutes. The Au conductive tracks have the surface resistances indicated in the manufactures' specifications and the Au/Pd points have excellent soldering properties.

| (2) | $SiO_2$ | 40.2 |
|---|---|---|
| | $Al_2O_3$ | 12.0 |
| | $K_2O$ | 5.2 |
| | $CaO$ | 26.7 |
| | $MgO$ | 2.2 |
| | $B_2O_3$ | 9.6 |
| | $MoO_3$ | 2.9 |
| | $TiO_2$ | 1.2 |

EXAMPLE 3

An enamel having the composition (1) is prepared for electrophoretic coating by the method described in Example 1.

A steel support with perforations is provided for the coating. These perforations have a diameter of 1.2 mm and open onto the surface at rightangles, i.e. they are not rounded off. After electrophoretic coating (50 V, 24 sec.), loose enamel particles adhering to the surface are removed by rinsing and the enamelled substrate is stoved at 890° C. for 30 minutes.

The thickness of the layer obtained on the surface of the substrate and in the perforations is about 170 μm and the dielectric resistance at the entrance to the perforations is >1 KV.

Application of the conductive structures and passage of the contacts through the perforations are carried out by a printing process on each side with commercial Ag/Pd paste which is subsequently burnt in by stoving in a continuous furnace at 850° C. for 10 minutes. Wired electronic components are then inserted in the circuit board thus obtained. The components are soldered with commercial Pb/Sn solder in a wave soldering machine.

EXAMPLE 4

An enamel having the oxidic composition (2) is ground dry together with 0.15% silicone oil (Si-H functional) so that a residue of 0.5 to 1% is left on a screen having a mesh of 40 μm.

The powder thus obtained is made up into a paste with 35% (based on the quantity of enamel powder) of a screen printing oil based on pine oil. This mixture is homogenized on a rolling mill to form a uniform paste.

This enamel paste is used for coating the whole surface of an enamel steel substrate produced as described in Example 1. The enamel paste is applied by the screen printing technique, using a refined steel screen having a 200 mesh width. The enamel paste is dried at 200° C. for one hour and then stoved in a continuous furnace at a peak temperature of 890° C. for 10 minutes.

It is possible by this method to build up enamel layers having thicknesses (e.g. 500 μm) which cannot easily be obtained by the electrophoretic method.

EXAMPLE 5

Conductive tracks are applied by screen printing, using commercial Au paste, to an enamelled steel substrate produced with an enamel having the composition (1) as described in Example 1 and the tracks are stoved in a continuous furnace at 890° C. for 30 minutes. In a second step, these conductive tracks, with the exception of their soldering points are completely covered by printing with an enamel paste described in Example 4. This enamel paste is stoved under the same conditions and thereafter has a layer thickness of about 50 μm. In a third step, conductive tracks in the form of intersections are applied, again by means of Au paste, to the surface which have been printed with enamel paste, and these intersections are also stoved at 890° C. for 10 minutes.

The conductive tracks have high dielectric strengths in relation to each other and demonstrate that thick film pastes based on enamel can be used as dielectric pastes.

EXAMPLE 6

An enamel having the oxidic composition (2) is ground dry with 0.6% silicone oil so that a residue of 0.5 to 1% is left on a screen having a mesh width of 40 μm.

The powder thus obtained is introduced into the fluidization container of a suitable powder electrostatic apparatus. A spray gun is provided for electrostatically charging the powder and depositing it on the steel substrate. The powder is then stoved in the usual manner at 890° C. within 30 minutes.

Enamelled steel substrates produced by this method may be used for the manufacture of circuit structures by the thick film technique as described above (Examples 1, 2, 3 and 5).

EXAMPLE 7

In electrotechnology, it is sometimes desirable to be able to use three-dimensional circuit boards. Two different metal bodies are used for this purpose, one consisting of a board having edges set at an angle of 45° and the other having rightangled edges. Enamelling is carried out with an enamel having the composition (1) and stoving is carried out as described in Example 3. Due to the crystallization which occurs at the moment of melting, and the resulting increase in viscosity, this enamel is capable of perfectly coating rightangled edges (i.e. edges which have only a small radius of curvature).

What is claimed is:

1. A substrate with an enamel layer having a heterogeneous structure containing at least two different phases obtained by applying a homogeneous, alkali-containing enamel powder to the substrate followed by heating at 850° to 1,000° C. wherein the enamel powder has the composition consists essentially of

| | |
|---|---|
| $Si_{O2}$ | 40–50% by weight |
| $Al_2O_3$ | 8–15% by weight |
| $Na_2O + K_2O$ | 4–16% by weight |
| $CaO + BaO$ | 25–35% by weight |
| MgO | 0–3% by weight |
| $B_2O_3$ | 0–10% by weight. |

2. The enamelled substrate according to claim 1 wherein the enamel powder is applied to the substrate by electrophoretic deposition from an aqueous solution.

3. The enamelled substrate according to claim 1 wherein the enamel powder is applied to the substrate by powder electrostatic application.

4. The enamelled substrate according to claim 1 wherein the enamel powder is applied to the substrate in the form of a paste containing said powder.

5. The enamelled substrate according to claim 4 wherein the substrate is glass or ceramic.

6. The enamelled substrate according to claim 1 wherein the substrate is a metal substrate.

7. The enamelled substrate according to claim 1 wherein the substrate is a perforated metal core for electric printed circuit boards.

8. The enamelled substrate according to claim 1 wherein the substrate is electrically conductive structures in multilayered electric circuits.

9. An electronic circuit combination comprising passive electronic elements placed on the enamelled substrate of claim 1 by thick or thin film techniques.

10. An electronic circuit combination according to claim 9 wherein the passive electronic elements comprise electrically conductive paths applied to the enamelled layer by screen printing.

* * * * *